United States Patent [19]
Ogawa et al.
[11] 3,795,846
[45] Mar. 5, 1974

[54] INTEGRATED SEMI-CONDUCTOR DEVICE HAVING FUNCTIONAL REGIONS ISOLATED BY P-N JUNCTIONS THEREBETWEEN

[75] Inventors: Takuzo Ogawa; Kenzi Miyata; Hideyuki Yagi; Takeshi Sasaki, all of Hitachi, Japan

[73] Assignee: Hitachi, Ltd., Tokyo, Japan

[22] Filed: Sept. 29, 1972

[21] Appl. No.: 293,506

[30] Foreign Application Priority Data

Oct. 1, 1971 Japan ............................... 46-76344

[52] U.S. Cl. ..... 317/235 R, 317/234 F, 317/234 N, 317/234 W, 317/235 D, 317/235 E, 317/235 F

[51] Int. Cl. ........................ H01l 11/00, H01l 15/00

[58] Field of Search.. 317/234, 3, 3.1, 11, 514, 235, 317/22, 22.11, 22.1

[56] References Cited

UNITED STATES PATENTS

| | | | |
|---|---|---|---|
| 3,117,260 | 1/1964 | Noyce | 317/235 E |
| 3,150,299 | 9/1964 | Noyce | 317/235 E |
| 3,337,751 | 8/1967 | Poston | 317/235 E |
| 3,372,070 | 3/1968 | Zuk | 317/235 E |
| 3,383,760 | 5/1968 | Shwartzman | 317/234 W |
| 3,463,970 | 8/1969 | Gutzwiller | 317/234 W |
| 3,573,516 | 4/1971 | Lyon | 317/234 W |
| 3,673,468 | 6/1972 | Schafer | 317/234 W |
| 3,699,402 | 10/1972 | McCann et al. | 317/234 W |

*Primary Examiner*—Andrew J. James
*Attorney, Agent, or Firm*—Craig and Antonelli

[57] ABSTRACT

An integrated semiconductor rectifier device comprising a semiconductor substrate having a pair of mutually opposed principal surfaces, said substrate including a plurality of function regions of diodes or thyristors with their end surfaces exposed at said pair of principal surfaces respectively with an isolation region provided therebetween.

31 Claims, 33 Drawing Figures

INTEGRATED SEMI-CONDUCTOR DEVICE HAVING FUNCTIONAL REGIONS ISOLATED BY P-N JUNCTIONS THEREBETWEEN

BACKGROUND OF THE INVENTION

1. Field of the Invention

This invention relates to an integrated semiconductor rectifier device.

2. DESCRIPTION OF THE PRIOR ART

Full-wave rectifier devices using diodes (or thyristors) are widely used as power source circuits in various domestic and industrial electrical devices, and thus a reduction in size and in manufacturing costs is desired.

This is due to the fact that though electric circuits of smaller electric capacity have been formed into integrated circuits by technical developments in semiconductor devices, those of larger power capacity are not well integrated and thus the miniaturization and costing-down of the total electric devices could not fully have been made.

At the present stage, full-wave rectifiers are formed by connecting a required number of armored diodes and/or thyristors. These full-wave rectifiers have such drawbacks that they become large and are of high cost because each diode (or thyristor) is armored and interconnections between them are needed. Further, for interconnecting diodes (or thyristors) there are needed electrodes directly contacting semiconductor substrates, lead wires penetrating through armor, and interconnection wires connecting said lead wires. Thus, the number of connections increases and hence reliability in connection decreases.

Various methods have been proposed for eliminating said drawbacks. For example, a full-wave rectifier can be made by the method of a so-called hybrid integrated circuit in which semiconductor substrates having predetermined PN junctions are directly bonded on an insulating substrate having a conducting circuit pattern on its surface. According to this hybrid integrated circuit method, however, since the interconnections between semiconductor substrates are made through a conducting circuit pattern, electrodes of a semiconductor substrate should be formed on one principal surface and thus the junction structure in the semiconductor substrate should take a planar structure or a lateral structure. In these structures, a current is arranged to flow in the lateral direction (a direction perpendicular to the thickness) in the semiconductor substrate, and thereby the forward voltage drop is large, i.e. heat generation in the semiconductor substrate is large. Therefore, it is difficult to make full-wave rectifiers of large capacity according to the hybrid integration method. Further, in such structures, distances between electrodes should be small for the purpose of miniaturization, but then the breakdown voltage cannot be high. On the contrary, if a high breakdown voltage is desired, the distance between electrodes should be made large and then the dimension of the total device would become large. Furthermore, since one principal surface of a semiconductor substrate is fixed to an insulating substrate in the hybrid integration method, a cooling fin could be provided only on the other surface, resulting in a poor cooling efficiency, and hence it is difficult to apply this method to a full-wave rectifier of a large current capacity.

There is proposed another method in which a plurality of regions having rectifying functions are formed in the same semiconductor substrate. In this method, for example, a P type impurity is selectively diffused into an N type semiconductor substrate to form a plurality of P type regions, or P type protruding regions are formed on a principal surface of an N type semiconductor substrate to form a rectifier device including a plurality of diodes the N type regions of which are common and the P type regions of which are separate.

According to such a method, there is a possibility that a PNP transistor may be formed in the adjacent diode regions to short-circuit the two regions. The width of the N type region between P type regions should be made larger than 1 mm for preventing the transistor function between the P type regions. Therefore, a compact rectifier device can hardly be made by this method either. Further, in the case of providing a full-wave rectifier (bridge circuit) two said devices are needed and there arise similar drawbacks as described above.

SUMMARY OF THE INVENTION

An object of this invention is to provide an integrated semiconductor rectifier device having a novel structure.

Another object of this invention is to provide an integrated semiconductor rectifier device having a large current capacity.

Further object of this invention is to provide an integrated semiconductor rectifier device of high breakdown voltage.

Another object of this invention is to provide an integrated semiconductor rectifier device including a plurality of function regions formed in the same semiconductor substrate and isolated by a novel method.

Another object of this invention is to provide an integrated semiconductor rectifier device, enabling a reduction in the number and amount of the armor members and connecting lead wires and in the total dimensions of the device.

Another object of this invention is to provide an integrated semiconductor rectifier device enabling a reduction in the manufacturing cost by the reduction in the armor members and the interconnection members and by the simplification of the interconnection operation between function regions.

According to an embodiment of this invention, there is provided an integrated semiconductor rectifier device comprising a semiconductor substrate having a pair of mutually opposed principal surfaces, at least four regions of rectifying function having opposite rectifying directions and an isolating region for isolating said rectifying regions from one another, all of said regions being integratedly formed in said substrate in such a manner that the two end surfaces of said respective function regions are exposed at said pair of principal surfaces and function regions of at least one rectifying direction are surrounded by respective independent regions of the opposite conductivity type to that of said substrate, thereby eliminating the drawbacks of the prior art devices described above.

Other objects, features and advantages of this invention ill become apparent in the following description made in will with the accompanying drawings.

DESCRIPTION OF THE PREFERRED EMBODIMENTS

Figure 1:
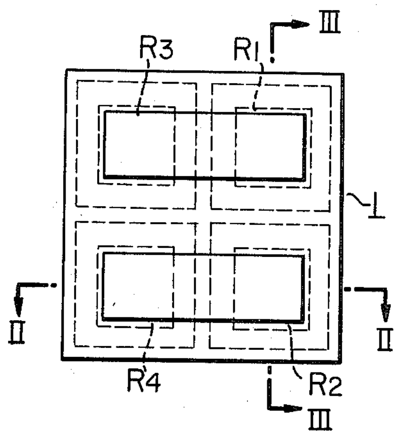
FIG. 1 is a plan view of one embodiment of the integrated semiconductor rectifier device according to this invention.
Figure 2:
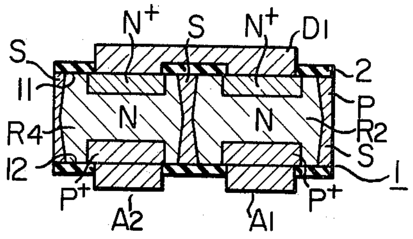
FIG. 2 is a cross-section taken along line II — II of FIG. 1.
Figure 3:
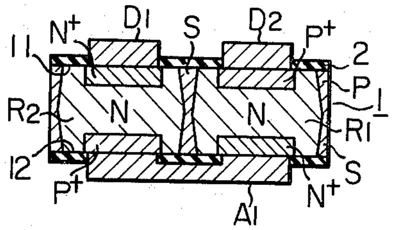
FIG. 3 is a cross-section taken along line III — III of FIG. 1.
Figure 4:
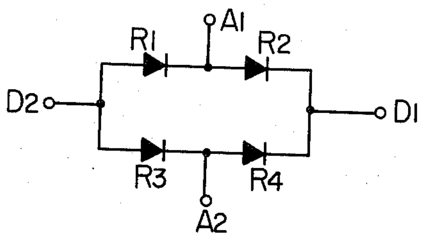
FIG. 4 is a circuit diagram of a single-phase full-wave rectifier.

FIGS. 1, 2, and 3 show an embodiment of the present invention applied to a single-phase full-wave rectifier device in which a semiconductor substrate 1 has a pair of mutually opposed principal surfaces 11 and 12, four regions having diode function $R_1$, $R_2$, $R_3$ and $R_4$ are formed in said semiconductor substrate 1 with their principal surfaces common to those of the substrate, and an isolating region S is formed in the substrate 1 to isolate each of said function regions $R_1$, $R_2$, $R_3$ and $R_4$. The function regions are so formed that each of the PN junctions is exposed at one principal surface and that the regions $R_1$ and $R_3$ have a rectifying direction opposite to that of the regions $R_2$ and $R_4$. The isolating region S may be formed of one region having a conductivity type similar to that of the adjacent portions of the function regions (N type in the figure) so that the numbers of the armor member needed for passivating the semiconductor substrate form the surrounding atmosphere may be one. Further, interconnection members between the function regions and electrodes of the function regions can be co-used so that a reduction in size and cost of the device can be achieved. Further, since interconnections between the function regions can be formed inside the armor, the reliability of the connections can be improved. Yet further, since the respective function regions have the end surfaces and the electrodes located on the opposite principal surfaces of the substrate, the load current in the function region necessarily flows in the thickness direction of the substrate, thereby the forward voltage drop and the heat generation are small and a large current can be allowed to flow. Further, since the electrodes in each function region are provided on the opposite principal surfaces so that the distance between the electrodes is made large and the function regions are mutually isolated by the isolating region so that a voltage of any polarity can weaken the isolation, said device has a high breakdown voltage.

Figure 5:
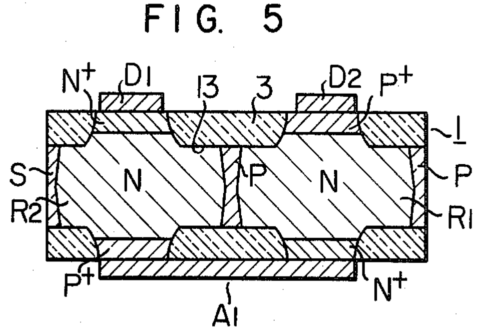
FIGS. 5, 6, 7, and 8 are schematic cross-sectional or perspective views of alternative embodiments of the rectifier device shown in FIG. 1.
Figure 6:
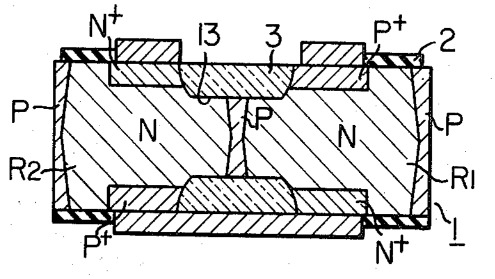

FIGS. 5 and 6 show other embodiments of a rectifier in which the exposed portions of PN junctions in the device of FIGS. 1 to 3 are sealed with glass to improve the breakdown voltage.

In the present semiconductor device as shown in FIGS. 1 to 3, the PN junction of respective function regions should terminate on a principal surface from the point of providing an isolation region. In this case, a PN junction may be formed of a portion parallel to the principal surface and another portion perpendicular to the principal surface. When such a PN junction is reversely biased, concentration of electric field occurs at the intersection of the portion parallel to the principal surface and the portion perpendicular to the principal surface. Thus, if a high voltage is applied, breakdown may occur at such a position. Further in the embodiment of FIGS. 1 to 3, for simplifying the interconnection of the respective function regions and improving the reliability of the connection, d.c. and a.c. terminals are formed on the semiconductor substrate through an oxide film 2. In such a structure, there is a possibility that a region of high carrier concentration, called an induced channel, is formed on the semiconductor substrate surface corresponding to the d.c. terminals (including a.c. terminals) and that the function regions are short-circuited. The occurrence of this induced channel becomes larger as the used voltage becomes higher.

The semiconductor devices shown in FIGS. 5 and 6 can solve the above problems. Portions of PN junctions perpendicular to the principal surface are removed by etching or sand blasting the semiconductor surface except the portions for d.c. terminals (including a.c. terminals) and grooves 13 are thus formed. These grooves 13 are filled with glass 3. According to this structure, since the perpendicular portions of the PN junctions are almost completely removed, there occurs no concentration of electric field. Further, impurity concentration near the exposed ends of the PN junctions is also lowered to some extent. Therefore, the possibility of breakdown is much reduced. The thickness of the glass 3 may be selected to be several tens microns and the occurrence of induced channel is reduced.

In the structure of FIGS. 5 and 6, when only the problem of breakdown is considered, glass is preferably applied to all the portions of the principal surfaces except those for providing d.c. terminals (including a.c. terminals). When the method as described hereinbelow is employed, glass is preferably applied to only between the function regions and other portions are covered with an oxide film as is shown in FIG. 6 from the viewpoint that damage in cutting operation can be prevented.

In applying glass to a semiconductor substrate, it is necessary to provide glass layers symmetrically with respect to the two principal surfaces for preventing deformation of the substrate due to contraction after sintering.

Figure 7:
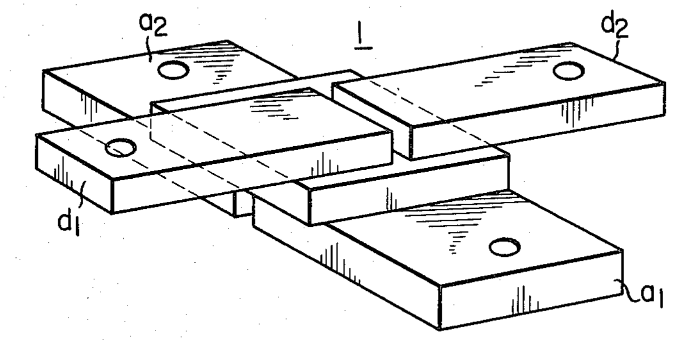

FIG. 7 shows another embodiment of this invention in which cooling efficiency is improved by using metal plates larger than the semiconductor substrate as the d.c. and/or a.c. terminals of the semiconductor devices of FIGS. 1 to 6. Namely, instead of forming d.c. and a.c. terminals as shown in the devices of FIGS. 1 to 3 and FIGS. 5 and 6, metal plates $d_1$, $d_2$, $a_1$, and $a_2$ are provided as in FIG. 7 to function as interconnection members between the function regions, d.c. and a.c. terminals, and cooling fins to improve the heat dissipation and the current capacity.

Generally in integrated semiconductor circuits, current capacity is limited to very low values, e.g. several hundreds of milliamperes, from the problem of heat dissipation. This is due to the fact that according to the known integrated circuit techniques electrodes are formed only on one principal surface of the substrate and thus there is no space for providing a cooling fin. According to the present semiconductor device, since both principal surfaces can be used, using a 5 mm square substrate a current up to about 1 ampere is allowed to flow in the structures of FIGS. 1 to 3, FIG. 5 and FIG. 6. When cooling fins are provided to the same substrate as in FIG. 7, current capacity can be further increased.

Figure 8:
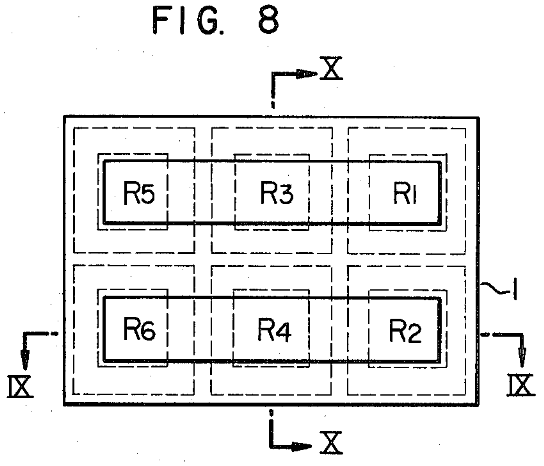
Figure 9:
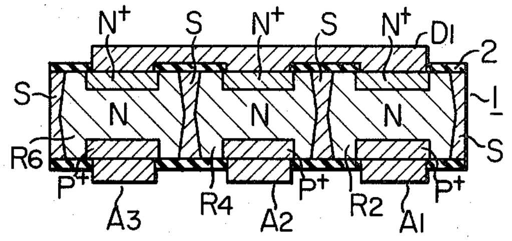
FIG. 9 is a cross-section taken along line IX — IX of FIG. 8.
Figure 10:
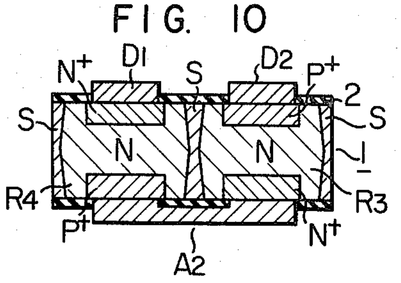
FIG. 10 is a cross-section taken along line X — X of FIG. 8.

FIGS. 8, 9 and 10 show an embodiment of a three-phase full-wave rectifier according to this invention. In this embodiment, there are added to the device of FIGS. 1 to 3, function regions $R_5$ and $R_6$ having respective rectifying directions similar to those of the function regions $R_1$ and $R_3$ and the regions $R_2$ and $R_4$, and a connecting terminal $A_3$ forming contacts with low resistance to the end layers of the function regions $R_5$ and $R_6$ on the other principal surface 12 of the substrate 1 and thus connecting the two. Further, d.c. terminals $D_1$ and $D_2$ are extended to the end layers of the function regions $R_5$ and $R_6$ on the one principal surface 11 and form low resistance contacts therewith.

Figure 11:
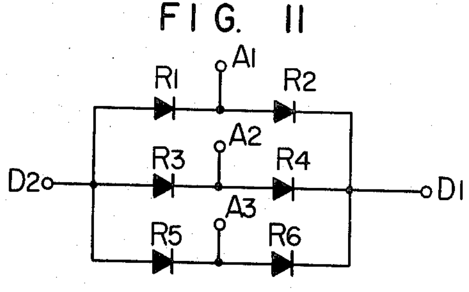
FIG. 11 is a circuit diagram of a three-phase full-wave rectifier.

Thus, a three-phase full-wave rectifier circuit shown in FIG. 11 can be formed in a single semiconductor substrate as an integrated circuit.

Description has been made on full-wave rectifier devices comprising a plurality of regions of diode function, but this invention is similarly applicable to half-wave rectifiers comprising diodes and full-wave and half-wave rectifiers comprising thyristors. Namely, in the former case such devices can be made by dividing the single-phase full-wave rectifier device shown in FIGS. 1 to 3 and the three-phase full-wave rectifier device shown in FIGS. 8 to 10 into two portions, and in the latter case a full-wave rectifier device can be made by substituting the function regions of the devices shown in FIGS. 1 to 3 and FIGS. 8 to 10 with thyristors and a half-wave rectifier device can be made by dividing them into two portions.

Figure 12:
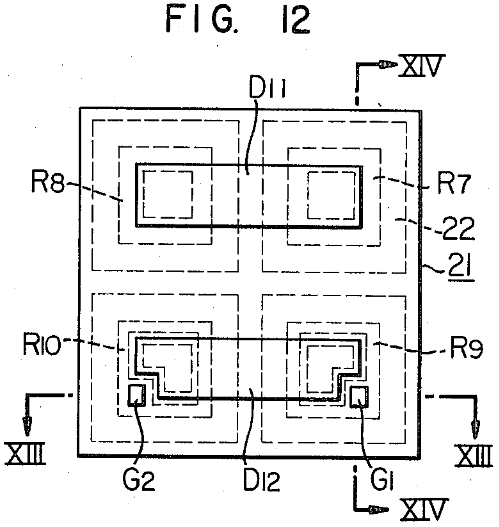
FIG. 12 is a plan view of another embodiment of the present device.
Figure 13:
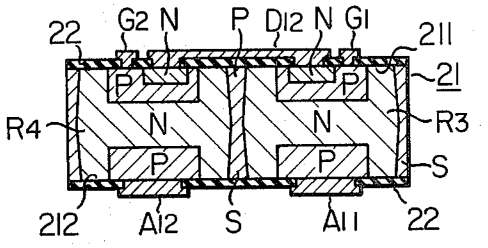
FIG. 13 is a cross-section taken along line XIII — XIII of FIG. 12.
Figure 14:
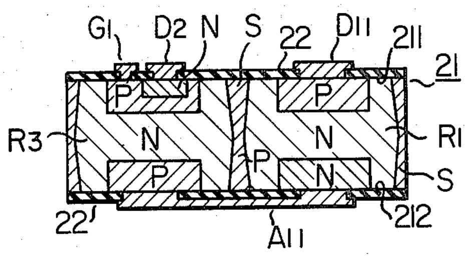
FIG. 14 is a cross-section taken along line XIV — XIV of FIG. 12.
Figure 15A:
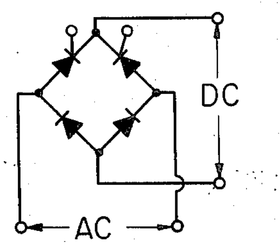
FIGS. 15*a* and 15*b* are circuit diagrams of single-phase full-wave rectifiers comprising diodes and thyristors.
Figure 15B:
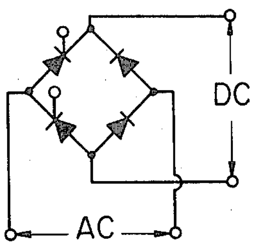

FIGS. 12, 13 and 14 show a full-wave rectifier device comprising regions of thyristor function and regions of diode function. In the figures, a semiconductor substrate 21 has a pair of principal surfaces 211 and 212 and comprises regions of diode or thyristor function $R_7$, $R_8$, $R_9$ and $R_{10}$ having the respective principal surfaces exposed at those of the substrate, and an isolating region S for isolating the respective function regions $R_7$, $R_8$, $R_9$ and $R_{10}$. The diode regions $R_7$ and $R_8$ and the thyristor regions $R_9$ and $R_{10}$ have mutually opposite rectifying directions. All of the PN junctions of the respective function regions terminate at either one of the principal surfaces 211 and 212 and are exposed thereat. The isolating region S has an opposite conductivity type to that of the adjacent portions of the function regions (shown as N type in the figures) and the two end surfaces exposed at the principal surfaces of the substrate. A pair of d.c. terminals $D_{11}$ and $D_{12}$ electrically connect the external layers of the diode regions $R_7$ and $R_8$ and the external layers of the thyristor regions $R_9$ and $R_{10}$ on one principal surface of the substrate and a.c. terminals $A_{11}$ and $A_{12}$ electrically connect the external layers of the diode region $R_7$ and the thyristor region $R_9$ and the external layers of the diode region $R_8$ and the thyristor region $R_{10}$ on the other principal surface of the substrate. Control electrodes $G_1$ and $G_2$ are respectively connected to the surfaces of the P type intermediate layers of the thyristor regions $R_9$ and $R_{10}$ exposed at one principal surface 11. These control electrodes may be provided to other layers than the P type intermediate layer. An oxide film 22 covers the pair of principal surfaces except those portions brought into contact with the d.c. terminals $D_1$ and $D_2$, the a.c. terminals $A_1$ and $A_2$, and the control electrodes $G_1$ and $G_2$. This oxide film 22 is used for passivating the substrate surface and insulating the intermediate portions of the d.c. terminals $D_1$ and $D_2$, the a.c. terminals $A_1$ and $A_2$ from the substrate surface. Thus, a full-wave rectifying circuit shown in FIGS. 15a and 15b could be integrated in a single semiconductor substrate.

Next, a method of making the present semiconductor device will be described taking an example in the case of using an N type silicon plate.

Figure 16:
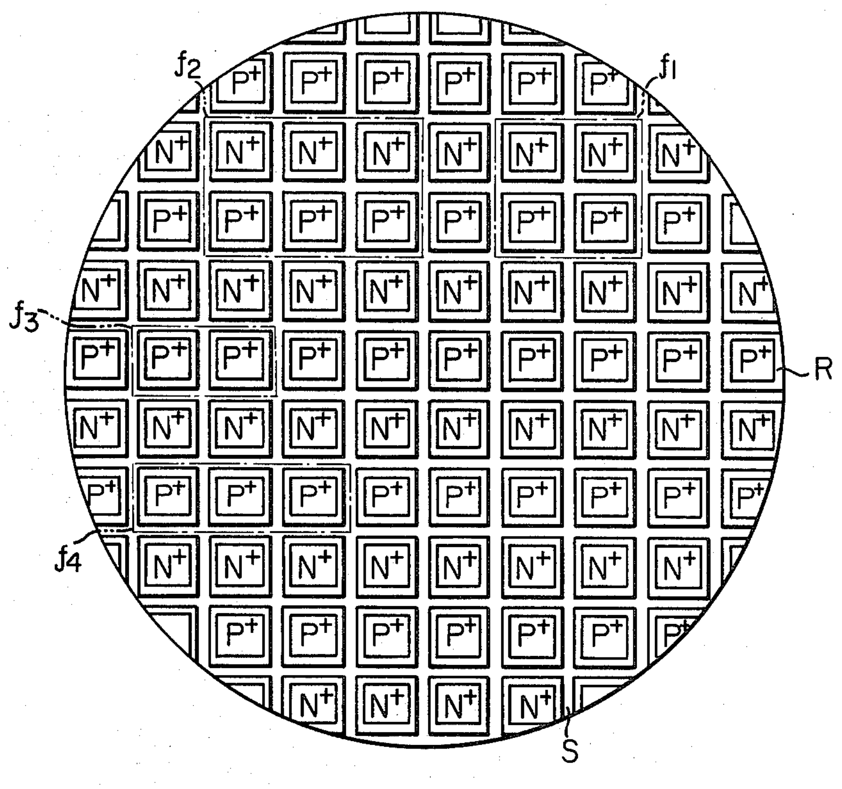
FIG. 16 is a plan view of a silicon wafer used in the present device.

First, both surfaces of a silicon plate are treated to have an oxide film. The portions of the oxide film which corresponds to the exposed portions of the isolating region are removed by photoetching techniques to form lattice-shaped grooves. These grooves are registered on both sides of the silicon plate. Then, boron is diffused from the groove portions so that the diffused regions from the two surfaces are connected to each other in the silicon plate. The diffused regions may not be connected in the silicon plate in this step, but in such a case diffusion is done to such a depth that the diffused regions are connected in the following diffusion steps. Then, those portions of the oxide film which correspond to the $P^+$ type layer in the function regions R surrounded by the isolating region S are removed and boron is diffused from these portions. The portions diffused with boron are so selected that in the silicon plate they are distributed in every other line and that these lines are off-set on the two surfaces. Then the oxide film on the function regions surrounded by the isolating region except the boron diffused portions is removed and phosphorus is diffused therefrom to form $N^+$ type layers. Through the above steps, an array of $PNN^+$ type diode regions is formed in the silicon plate with alternating rectifying directions. Such a silicon plate is shown in FIG. 16 with the oxide film removed. The method and order of the above diffusion steps are not fixed but appropriately arranged to select the simplest way. In the case of making single-phase full-wave rectifier devices, the silicon plate is cut into units of four of each along the isolating region as shown by dotted broken lines $f_1$ in the figure after forming d.c. and a.c. terminals by evaporation or plating. In the case of making three-phase full-wave rectifiers, the silicon plate is cut into units of six of each as shown by the dotted broken lines $f_2$ in the figure. In the cases of making single-phase or three-phase half-wave rectifier devices, the silicon plate is cut into units of two or three of each as shown by the dotted broken lines $f_3$ or $f_4$ in the figure. Then each semiconductor device is armored to finish it into a complete device. A resin or glass mold, a metal case, or a case of metal and ceramic, etc. are used as the armor.

As is described above, according to the present invention formation of electrodes contacting function regions with low resistance and interconnection of the function regions can be simultaneously done so that the manufacturing steps are also reduced.

Figure 17:
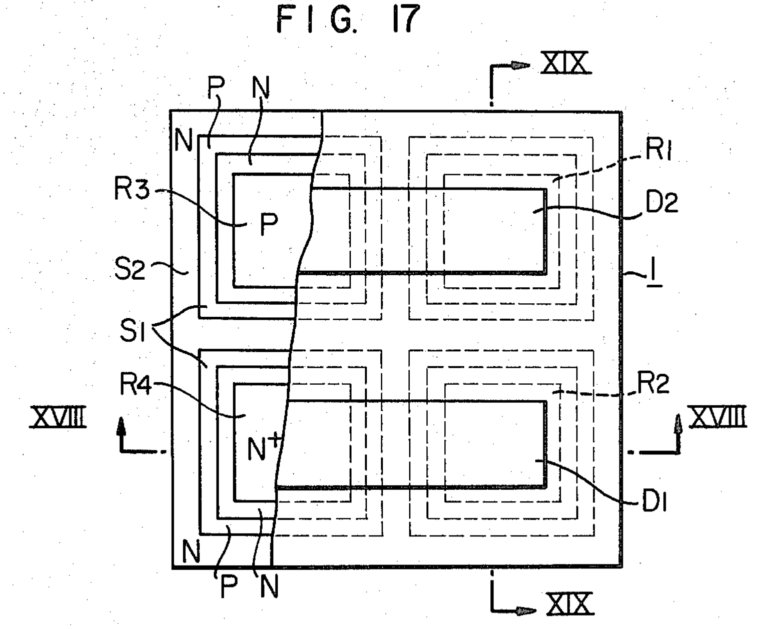
FIG. 17 is a plan view of further embodiment of the present device.
Figure 18:
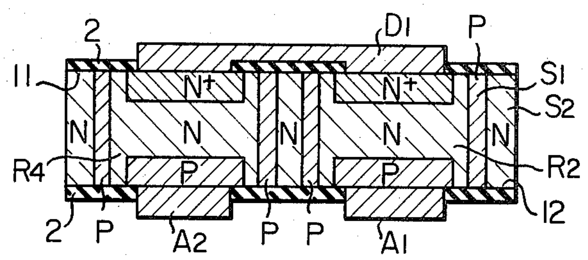
FIG. 18 is a cross-section taken along line XVIII — XVIII of FIG. 17.
Figure 19:
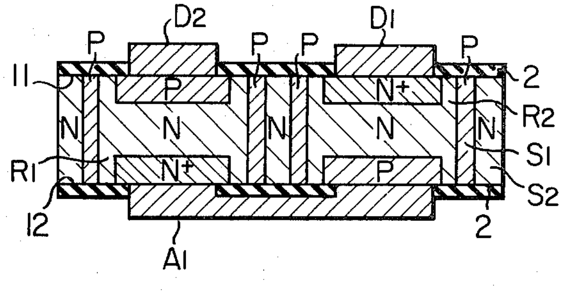
FIG. 19 is a cross-section taken along line XIX — XIX of FIG. 17.

FIGS. 17, 18 and 19 show an integrated semiconductor rectifier device in which the isolating region S of the integrated semiconductor rectifier device of FIGS. 1 to 3 is now formed of a first portion $S_1$ of a different conductivity type to that of the substrate and a second portion $S_2$ of a different conductivity type to that of the first portion $S_1$ formed so as to divide the first portion into two.

Figure 20:
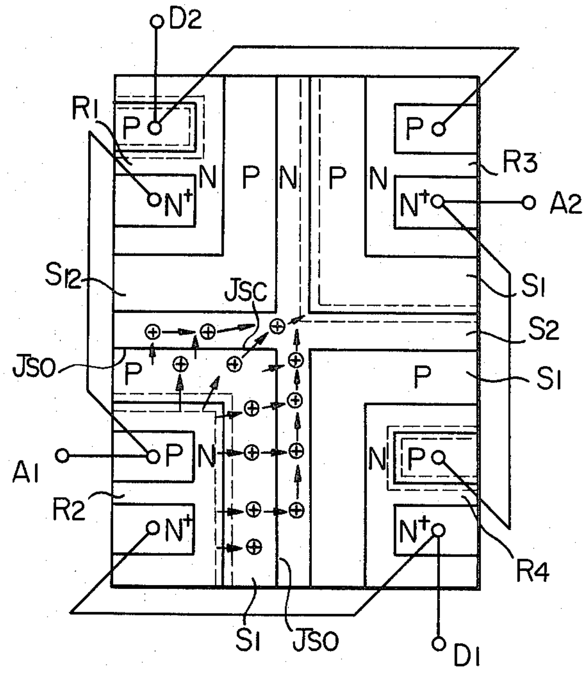
FIG. 20 is an extended view of the device of FIG. 17 for explaining the operation thereof.

According to such a structure there can be provided a further advantage to those obtained by the device of FIGS. 1 to 3 that the breakdown voltage between adjacent function regions becomes high and thereby the resultant device can be used as one of high breakdown voltage. This will be described referring to FIG. 20. FIG. 20 shows the semiconductor rectifier device of FIGS. 17, 18 and 19 but extended on a plane.

In the figure, if a voltage is applied between a.c. terminals $A_1$ and $A_2$ with the voltage of $A_1$ being positive, depletion layers are formed as shown by dotted lines. The voltage between the a.c. terminals $A_1$ and $A_2$ is blocked by the depletion layers around the PN junction between the function region $R_2$ and the first portion of the isolating region $S_1$ and the PN junction between the first and the second portions of the isolating region $S_1$ and $S_2$ around the function region $R_3$. If there exists no second portion $S_2$ in the insulating region, a PNP type transistor is formed by the function region $R_2$ and the first portion $S_1$ of the isolating region with the load current in the function region $R_2$ working as the base current. Then, a current is allowed to flow between a.c. terminals $A_1$ and $A_2$ by the transistor function. It is similar to that where the a.c. terminals $A_1$ and $A_2$ are short-circuited. Therefore, the device no longer functions as a full-wave rectifier device. To remove the influence of such transistor function only by the existence of the first portion $S_1$ of the isolating region, it is necessary to increase the separation between the function regions $R_2$ and $R_3$ to prevent the current due to the transistor function from reaching the function region $R_3$.

In contrast to the above, if the isolating region is formed of independent first portions surrounding the function regions and a second portion separating the first portions, the affect due to the transistor function can be removed without increasing the width of the isolating region. Namely, in the transistor formed of the P and N type regions of the function region $R_2$ and the first portion $S_1$ of the isolating region, holes flowing from the P to the N region in the function region $R_2$ are drawn into the first portion $S_1$ of the isolating region. If holes enter the first portion $S_1$, the number of the majority carriers in the first portion $S_1$ increases and the increment of the majority carriers causes the injection of holes into the second portion $S_2$ of the isolating region. Holes injected into the second portion $S_2$ of the isolating region migrate toward the function region $R_3$ by diffusion. The injection of holes from the first portion $S_1$ to the second portion $S_2$ in the isolating region occurs along the whole periphery of the first portion $S_1$. The PN junction surrounding the function region $R_2$ and formed between the first portion $S_1$ and the second portion $S_2$ in the isolating region consists of a portion JSC (neighborhood of the angle in FIG. 20) through which function regions $R_2$ and $R_3$ are facing to each other and the other portions JSO. When the migration distance of holes injected from the first portion $S_1$ to the second portion $S_2$ through the junction portion JSO to migrate through the second portion $S_2$ by diffusion and reach the PN junction formed between the second portion $S_2$ and the first portion $S_1$ surrounding the function region $R_3$ and that of holes injected from the first portion $S_1$ to the second portion $S_2$ through the junction portion JSC are compared, the former becomes very much larger than the latter. Therefore, holes injected through the junction portion JSO are almost annihilated by recombination and the holes injected from the first portion $S_1$ to the second portion $S_2$ on the $R_2$ side and reaching the PN junction between the first portion $S_1$ and the second portion $S_2$ on the $R_3$ side are formed of those injected through the junction portion JSC. Holes injected through the junction portion JSC are only a small portion of holes injected from the first portion $S_1$ to the second portion $S_2$ and hence if there exists a transistor function between the function regions $R_2$ and $R_3$ the current allowed to flow therebetween is extremely small. Thus, there arises no possibility that the a.c. terminals of a full-wave rectifier circuit are substantially short-circuited or that the device is overheated by heat generation.

In the embodiment of FIGS. 17 to 19, the reason for the fact that the effects due to the transistor function possibly occurring between the function regions can be eliminated is summarized in that the holes generated by the transistor function are arranged to migrate by diffusion to increase the chance of recombination and that the path of holes is limited and the migration distance is arranged to be long.

Figure 21:
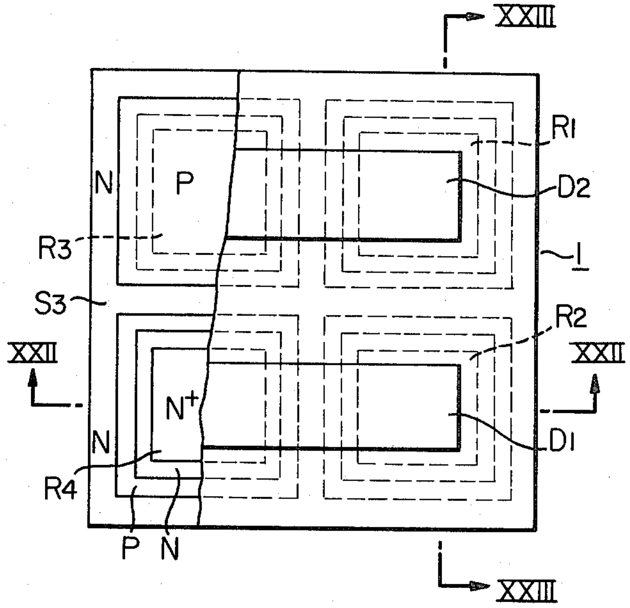
FIG. 21 is a plan view of another embodiment of this invention.
Figure 22:
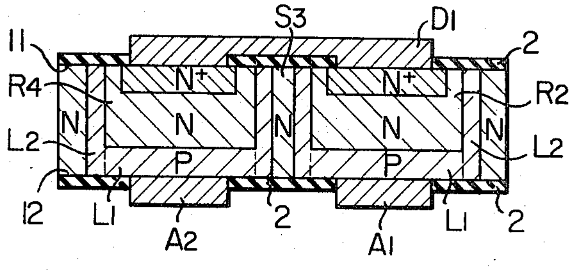
FIG. 22 is a cross-section taken along line XXII — XXII of FIG. 21.
Figure 23:
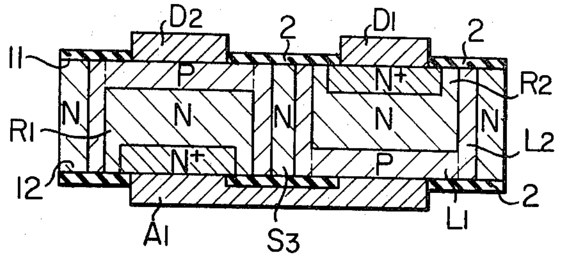
FIG. 23 is a cross-section taken along line XXIII — XXIII of FIG. 21.

FIGS. 21, 22 and 23 show another embodiment of the present integrated semiconductor rectifier device which is characterized by the fact that in the device of FIGS. 17 to 19 the first portion of the isolating region and the exterior portion of the function region surrounded by the first portion and having the same conductivity type as that of the first portion are electrically connected or physically connected to be kept at the same potential so as to perfectly remove the transistor function between the function regions.

Now description will be made referring to the figures. In the figures, a semiconductor substrate 1 has a pair of principal surfaces 11 and 12 and comprises four regions of diode function $R_1$, $R_2$, $R_3$ and $R_4$ having the respective end surfaces exposed at the principal surfaces 11 and 12. Each of these function layers comprises one layer of the same conductivity type to that of the substrate and another layer surrounding said one layer and having a different conductivity type to that of the substrate. Further, the rectifying directions of the function regions $R_1$ and $R_3$ and the regions $R_2$ and $R_4$ are arranged oppositely. An isolating region $S_3$ formed in the substrate isolates the respective function regions $R_1$, $R_2$, $R_3$ and $R_4$ from each other. A.c. and d.c. terminals are designed by $A_1$ and $A_2$, and $D_1$ and $D_2$ and an oxide film by 2 similar to the case of FIGS. 17 to 19.

In integrated semiconductor rectifier devices of such structure, since the layer having a different conductivity type from that of the substrate in the respective function region is formed of a portion $L_1$ parallel to the principal surface of the substrate and another portion $L_2$ perpendicular to the principal surface, the current flowing between the function regions in operation can be made smaller than that of the device of FIGS. 17 to 19. Namely, the device shown in FIGS. 21 to 23 is the same as one which may be formed by electrically connecting the first portion $S_1$ of the isolating region with the layer in the function region, which layer has the same conductivity type as that of the first region $S_1$ in the device shown in FIGS. 17 to 19. Thus, the extended view will be one in which the first portion $S_1$ of the isolating region and the layer in the function region surrounded by the first portion, which layer has the same conductivity type as that of the first portion (P layer) in FIG. 20 are electrically connected. By the electrical connection between these two layers, these two layers become of the same potential and no transistor function is generated therefrom. Therefore, currents allowed to flow between function regions $R_2$ and $R_3$, and between $R_1$ and $R_4$ in the device of FIGS. 17 to 19 no longer flow and a reduction in the temperature rise in the device can be further expected compared with the device of FIGS. 17 to 19.

Figure 24:
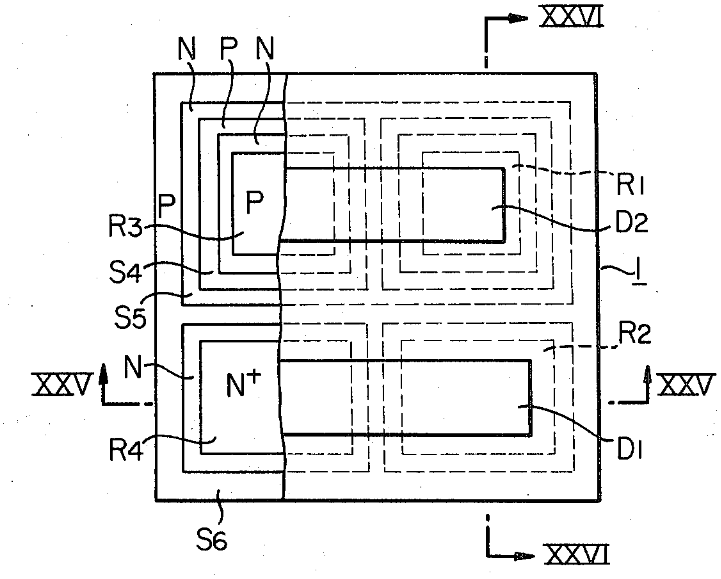
FIG. 24 is a plan view of another embodiment of this invention.
Figure 25:
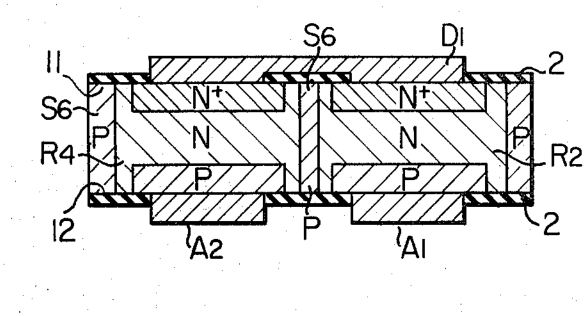
FIG. 25 is a cross-section taken along line XXV — XXV of FIG. 24.
Figure 26:
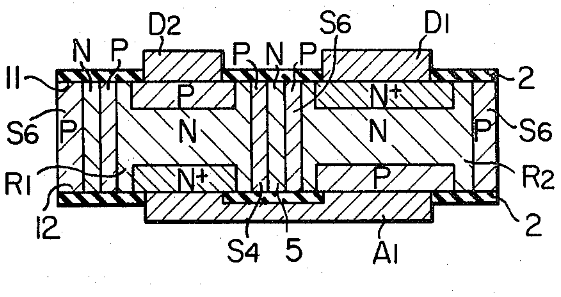
FIG. 26 is a cross section taken along line XXVI—XXVI of FIG. 24.

FIGS. 24, 25 and 26 show an alternative of the embodiment of FIGS. 17 to 19, which is characterized by the fact that two parallelly disposed function regions have independent and common isolating regions and the rest have a common isolating region. Namely, as is shown in the figures, four function regions $R_1$, $R_2$, $R_3$ and $R_4$ are formed in a semiconductor substrate in such a manner that two function regions $R_1$ and $R_3$ having one rectifying direction are surrounded by first isolating portions $S_4$ independently surrounding the respective function regions and by a common second isolating portion $S_5$ surrounding the respective function regions. Two other function regions $R_2$ and $R_4$ having the opposite rectifying direction are surrounded by a common isolating region $S_6$ surrounding the respective function regions. The isolating region $S_6$ is so formed as to surround the outermost periphery of the function regions having said one rectifying direction. The respective isolating regions $S_4$, $S_5$ and $S_6$ have a different conductivity type to that of the adjacent function or isolating regions and are exposed at the both principal surfaces of the substrate 1. $D_1$ and $D_2$ designate d.c. terminals, $A_1$ and $A_2$ a.c. terminals, and 2 an oxide layer.

According to a semiconductor rectifier devide of such a structure, since PNP three-layer regions are formed between the function regions $R_1$ and $R_4$, and between the function regions $R_2$ and $R_3$ which may form a current path, the leakage current between the function regions in operation can be made extremely small for similar reasons as those for the device of FIGS. 17 to 19.

Here, FIGS. 24 to 26 show the case where the isolating regions for the function regions of the same rectifying direction are made in a similar structure, but generally similar effects can be obtained by forming the isolating regions in a similar structure regardless of rectifying direction.

Figure 27:
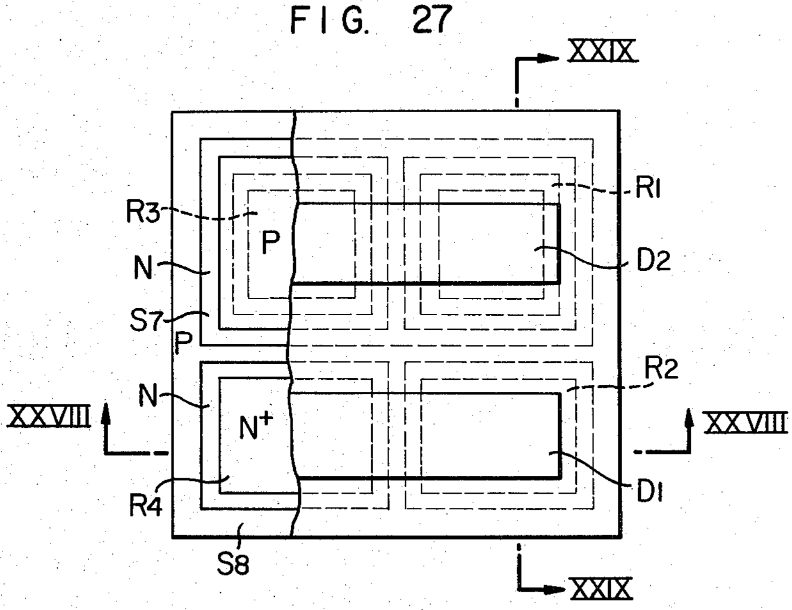
FIG. 27 is a plan view of another embodiment of this invention.
Figure 28:
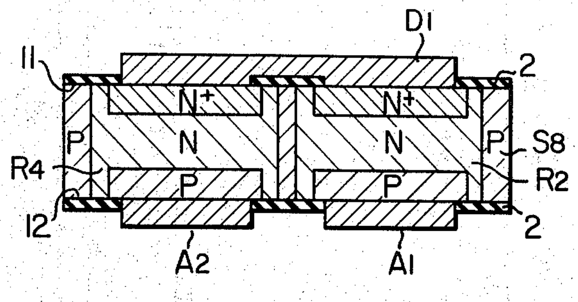
FIG. 28 is a cross-section taken along line XXVIII — XXVIII of FIG. 27.
Figure 29:
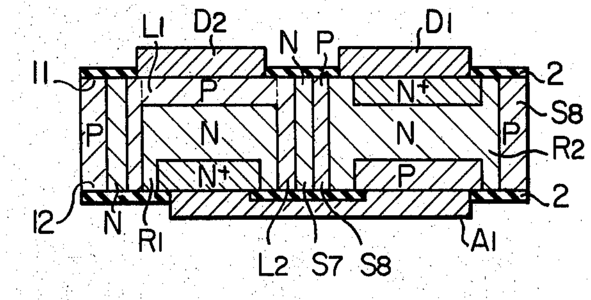
FIG. 29 is a cross-section taken along line XXIX — XXIX of FIG. 27.

FIGS. 27, 28 and 29 show a modification of the embodiment of FIGS. 21 to 23, which is characterized by the fact that only two parallel function regions are formed similar to those of FIGS. 21 to 23 to achieve a similar effect with a simpler junction structure than the device of FIGS. 21 to 23. Namely, as is shown in the figures, four function regions $R_1$, $R_2$, $R_3$ and $R_4$ are formed in a semiconductor substrate 1. The function regions $R_1$ and $R_3$ having one rectifying direction are respectively surrounded by a perpendicular portion $L_2$ continuous to one external layer $L_1$ of the function region and by a common isolating region $S_7$ surrounding the respective function regions, while two other function regions $R_2$ and $R_4$ having the other rectifying direction are respectively surrounded by a common isolating region $S_8$ which surrounds the respective function regions. The isolating region $S_8$ is so formed as to surround the outermost periphery of the function regions having said one rectifying direction. The isolating regions $S_7$ and $S_8$ have a different conductivity type from that of the adjacent function or isolating region and so formed as to be exposed at the both principal surfaces of the substrate 1. $D_1$ and $D_2$ designate d.c. terminals, $A_1$ and $A_2$ a.c. terminals, and 2 an oxide film.

According to a semiconductor rectifying device of such a structure, since the external layer $L_1$ and the vertical portion $L_2$ of the function regions $R_1$ and $R_3$ are arranged to be of the same potential, no transistor function occurs in the two and hence the leak current between the function regions in operation can be completely stopped. It is important here that the P type external layers of the function regions $R_1$ and $R_3$ alternately become positive in operation. For this purpose, d.c. terminals $D_1$ and $D_2$, a.c. terminals $A_1$ and $A_2$ are disposed as shown in the figures. If the mounting surfaces (principal surfaces) for the d.c. terminals $D_1$ and $D_2$, and the a.c. terminals $A_1$ and $A_2$ are reversed, in operation the external layers of the function regions $R_2$ and $R_4$ having P type conductivity become positive and a transistor function arises between the isolating region $S_8$ and them and then it becomes impossible to completely stop the leakage current between the function regions in operation. This leakage current, however, is so small due to the fact that the path is of PNPN type and made narrow by other function regions that no practical problem arises therefrom.

Figure 30:
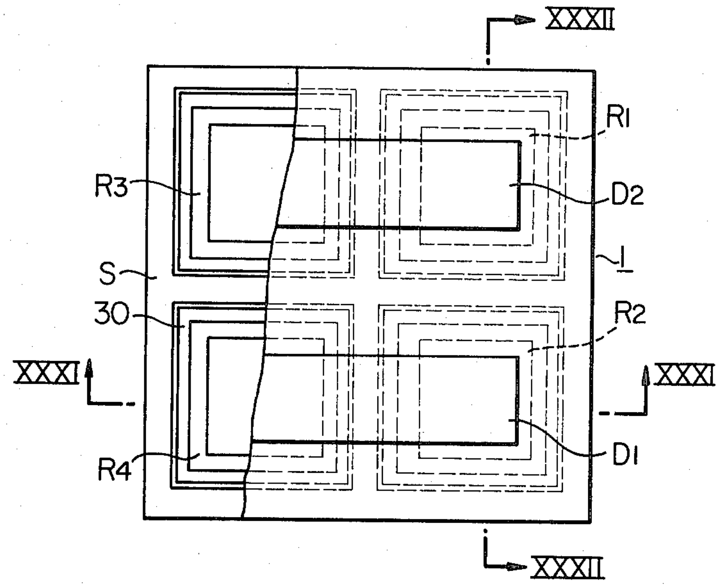
FIG. 30 is a plan view of another embodiment of this invention.
Figure 31:
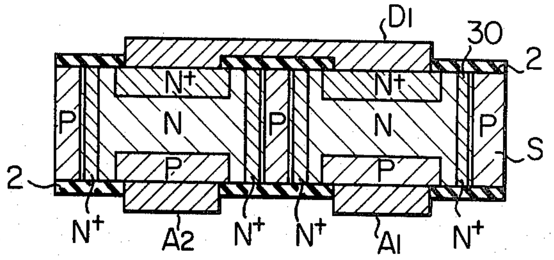
FIG. 31 is a cross-section taken along line XXXI — XXXI of FIG. 30.
Figure 32:
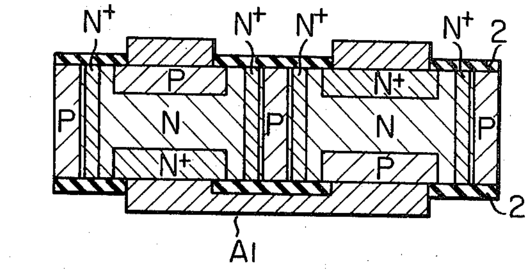
FIG. 32 is a cross-section taken along line XXXII — XXXII of FIG. 30.

FIGS. 30, 31 and 32 show an integrated semiconductor rectifier device in which in the device of FIGS. 1 to 3 heavily doped N type layers are formed on both sides of and separated from the isolating region S.

Such a device not only provides similar effects as those of the device of FIGS. 1 to 3 but can be used as a high breakdown voltage device. Description will be made referring to the figures hereinbelow.

In the figures, a semiconductor substrate 1 has a pair of opposing principal surfaces and comprises four function regions of diode function $R_1$, $R_2$, $R_3$ and $R_4$ with the respective end surfaces exposed at said pair of principal surfaces 11 and 12. These function regions are so formed that the rectifying direction of the regions $R_1$ and $R_3$ is opposite to that of the regions $R_2$ and $R_4$. The four function regions $R_1$, $R_2$, $R_3$ and $R_4$ are isolated mutually by an isolating region S formed in the substrate. This isolating region has a different conductivity type from that of the substrate and is exposed at the two principal surfaces 11 and 12. Sub-regions 30 having the same conductivity type as that of the substrate but heavily doped are located on the both sides of the isolating region S but separated with a predetermined distance therefrom. These sub-regions 30 are also exposed at the two principal surfaces. References $D_1$ and $D_2$ designate d.c. terminals, $A_1$ and $A_2$ a.c. terminals and 2 an oxide film similar to the foregoing embodiments.

According to an integrated semiconductor rectifier device of such a structure, since the $N^+$ regions 30 have a property of reflecting carriers, they prevent the migration of carriers from one function region to an adjacent function region. Thus, there is provided a larger effect of isolating the respective function regions than that of the device of FIGS. 1 to 3. Thus, a device of higher breakdown voltage can be provided. In FIGS. 30 to 32, the sub-regions 30 and $N^+$ layer of the function region are separately formed, but they may be formed to be continuous providing similar effects.

Further, this isolation system has a better effect of preventing channel formation compared with the isolation systems described hereinabove, and thus can separate function regions more effectively. Namely, in FIGS. 30 to 32, there are portions in the surface of the N type layers forming function regions. In these portions, surface portions might be inverted into P type according to the polarity of the current so that the P type region in the function region should be electrically connected with the isolating region. Then, a leakage current increases and it becomes difficult to obtain a device of high breakdown voltage. The $N^+$ type sub-regions have an effect of preventing the formation of an inversion layer. Therefore, a device of high breakdown voltage can be easily manufactured.

Next, this invention will be described with concrete numerical values. For example, for forming a diode bridge having a current capacity of 1 A and a reverse breakdown voltage of 300 V, the dimension of the principal surface was 5.5 mm × 5.5 mm according to the structure of FIGS. 1 to 3, 4.0 mm × 4.0 mm according to the structure of FIGS. 17 to 19, and 4.0 mm × 4.0 mm according to the structure of FIGS. 30 to 32.

We claim:

1. An integrated semiconductor circuit device comprising:
- a body of semiconductor material having first and second surfaces opposite one another, said body including
  - a first plurality of functional regions of a first type adjacent to one another; and
  - a second plurality of functional regions of a second type adjacent to one another and being adjacent to said first plurality of functional region of the first type,
- each functional region of said first type including
  - a first semiconductor region of a first conductivity type, extending to said first surface of said body, and
  - a second semiconductor region, of a second conductivity type opposite said first conductivity type, extending to said second surface of said body, contacting said first semiconductor region and forming a PN junction therewith,
- each functional region of said second type including
  - a first semiconductor region of said first conductivity type, extending to said second surface of said body, and
  - a second semiconductor region of said second conductivity type, extending to said first surface of said body, contacting said first semiconductor region of said functional region of said second type and forming a PN junction therewith, and
- wherein said body further includes
  - means for isolating each of said functional regions from each other comprising
    - a plurality of first isolating semiconductor regions of said second conductivity type extending between and contiguous with each of said functional regions and extending from said first surface to said second surface, and
    - a continuous second isolating semiconductor region of said first conductivity type extending between and contiguous with each of said first isolating semiconductor regions of said plurality of first isolating semiconductor regions and extending from said first surface to said second surface.

2. An integrated semiconductor device according to claim 1, further comprising:
- means for ohmically connecting the first semiconductor region of the respective functional regions of said first type to the second semiconductor regions of the respective functional regions of said second type;
- means for ohmically connecting the second semiconductor regions of the respective functional regions of said first type to each other; and
- means for ohmically connecting the first semiconductor regions of the respective functional regions of said second type to each other.

3. An integrated semiconductor device according to claim 1, wherein each first isolating semiconductor region surrounds a respective one of said functional regions.

4. An integrated semiconductor device according to claim 1, wherein said continuous second isolating semiconductor region surrounds each of said first isolating semiconductor regions.

5. An integrated semiconductor device according to claim 3, wherein said continuous second isolating semiconductor region surrounds each of said first isolating semiconductor regions.

6. An integrated semiconductor device according to claim 1, wherein a portion of each of the first semiconductor regions in said functional regions adjacent to the surface, which is opposite to the surface to which each second semiconductor region extends, has a higher impurity concentration than the reminder of each of the first semiconductor regions.

7. An integrated semiconductor device according to claim 1, wherein said semiconductor body includes a layer of insulting material selectively formed on each of said first and second surfaces overlying the interfaces of said first and second insulating semiconductor regions of said isolation means and the interfaces of said first isolating semiconductor regions and said functional regions.

8. An integrated semiconductor device according to claim 7, wherein said body further includes first and second grooves respectively extending into said body from said first and second surfaces thereof, between said first and second pluralities of functional regions and between the functional regions of the same type, respectively, said first and second grooves overlapping said respective interfaces and being filled with glass material as the insulating material therein.

9. An integrated semiconductor device according to claim 2, wherein said semiconductor body includes a layer of insulating material selectively formed on each of said first and second surfaces overlying the interfaces of said first and second insulating semiconductor regions of said isolation means and the interfaces of said first isolating semiconductor regions and said functional regions.

10. An integrated semiconductor device according to claim 9, wherein said body further includes first and second grooves respectively extending into said body from said first and second surfaces thereof, between said first and second pluralities of functional regions and between the functional regions of the same type, respectively, said first and second grooves overlapping said respective interfaces and being filled with glass material as the insulating material therein.

11. An integrated semiconductor device according to claim 9, wherein each of said ohmically connecting means comprises an electrode layer formed on that portion of said insulating material between said functional regions and contacting the respective surfaces of said body within said functional regions thereof.

12. An integrated semiconductor device according to claim 1, wherein each second semiconductor region of each respective functional region is contiguous with a respective first isolating semiconductor region of said isolating means.

13. An integrated semiconductor circuit device comprising:

a body of semiconductor material having first and second surfaces opposite one another, said body including a first plurality of functional regions of a first type adjacent to one another; and a second plurality of functional regions of a second type adjacent to one another and being adjacent to said first plurality of functional regions of the first type, each functional region of said first type including a first semiconductor region of a first conductivity type, extending to said first surface of said body, and a second semiconductor region, of a second conductivity type opposite said first conductivity type, extending to said second surface of said body, contacting said first semiconductor region and forming a PN junction therewith, each functional region of said second type including a first semiconductor region of said first conductivity type, extending to said second surface of said body, and a second semiconductor region of said second conductivity type, extending to said first surface of said body, contacting said first semiconductor region of said functional region of said second type and forming a PN junction therewith, and wherein said body further includes means for isolating each of said functional regions from one another comprising a plurality of first isolating semiconductor regions of said second conductivity type, respectively surrounding and contiguous with each of said functional regions of the first type and extending from said first surface to said second surface, a plurality of second isolating semiconductor regions of said first conductivity type, respectively surrounding and contiguous with respective ones of said first isolating regions, and extending from said first surface to said second surface, and a continuous third isolating semiconductor region of said second conductivity type extending between and contiguous with each of said second isolating semiconductor regions, extending between and contiguous with each of said functional regions of the second type, and extending between and contiguous with said functional regions of the second type and said second isolating regions.

14. An integrated semiconductor device according to claim 13, further comprising:

means for ohmically connecting the first semiconductor region of the respective functional regions of said first type to the second semiconductor regions of the respective functional regions of said second type;

means for ohmically connecting the second semiconductor regions of the respective functional regions of said first type to each other; and means for ohmically connecting the first semiconductor regions of the respective functional regions of said second type to each other.

15. An integrated semiconductor device according to claim 13, wherein said continuous third isolating semiconductor region surrounds each of said first and second isolating semiconductor regions.

16. An integrated semiconductor device according to claim 13, wherein a portion of each of the first semiconductor regions in said functional regions adjacent to the surface, which is opposite to the surface to which each second semiconductor region extends, has a higher impurity concentration than the remainder of each of the first semiconductor regions.

17. An integrated semiconductor device according to claim 13, where said body includes a layer of insulating material selectively formed on each of said first and second surfaces overlying the interfaces between said first, second and third isolating semiconductor regions of said isolation means and the interfaces between said first isolating semiconductor regions and said functional regions of the first type, and the interfaces between said third isolating semiconductor region and said functional regions of the second type.

18. An integrated semiconductor device according to claim 8, wherein said body further includes first and second grooves respectively extending into said body from said first and second surfaces thereof, between said first and second pluralities of functional regions and between the functional regions of the same type, respectively, said first and second grooves overlapping said respective interfaces and being filled with glass material as the insulating material therein.

19. An integrated semiconductor device according to claim 14, wherein said body includes a layer of insulating material selectively formed on each of said first and second surfaces overlying the interfaces between said first, second and third isolating semiconductor regions of said isolation means and the interfaces between said first isolating semiconductor regions and said functional regions of the first type, and the interfaces between said third isolating semiconductor region and said functional regions of the second type.

20. An integrated semiconductor device according to claim 19, wherein said body further includes first and second grooves respectively into said body from said first and second surfaces thereof, between said first and second pluralities of functional regions and between the functional regions of the same type, respectively, said first and second grooves overlapping said respective interfaces and being filled with glass material as the insulating material therein.

21. An integrated semiconductor device according to claim 19, wherein each of said ohmically connecting means comprises an electrode layer formed on that portion of said insulating material between said functional regions and contacting the respective surfaces of said body within said functional regions thereof.

22. An integrated semiconductor device according to claim 13, wherein each second semiconductor region of each respective functional region of the first type is contiguous with a respective first isolating semiconductor region of said isolating means.

23. An integrated semiconductor circuit device comprising:

a body of semiconductor material having first and second surfaces opposite one another, said body including a first plurality of functional regions of a first type adjacent to one another, and a second plurality of functional regions of a second type adjacent to one another and being adjacent to said first plurality of functional regions of the first type, each functional region of said first type including a first semiconductor region of a first conductivity type, extending to said first surface of said body and a second semiconductor region, of a second conductivity type opposite siad first conductivity type, extending to said second surface of said body, contacting said first semiconductor region and forming a PN junction therewith, each functional region of said second type including a first semiconductor region of said first conductivity type, extending to said second surface of said body, and a second semiconductor region of said second conductivity type, extending to said first surface of said body, contacting said first semiconductor region of said functional region of said second type and forming a PN junction therewith, and wherein said body further includes means for isolating said functional regions from each other comprising a plurality of peripheral semiconductor regions of said first conductivity type, having a relatively high impurity concentration, each of which peripheral regions surrounds and is contiguous with a respective one of said functional regions and extends from said first surface to said second surface, a plurality of thin semiconductor layers of said first conductivity type, and having a relatively low impurity concentration, extending from said first surface to said second surface and respectively surrounding and being contiguous with said peripheral regions, and an isolating semiconductor region of said second conductivity type extending between and contiguous with each of said thin semiconductor layers and extending from said first surface to said second surface.

24. An integrated semiconductor device according to claim 23, further comprising:

means for ohmically connecting the first semiconductor region of the respective functional regions of said first type to the second semiconductor regions of the respective functional regions of said second type;

means for ohmically connecting the second semiconductor regions of the respective functional regions of said first type to each other; and means of ohmically connecting the first semiconductor regions of the respective functional regions of said second type to each other.

25. An integrated semiconductor device according to claim 23, wherein said isolating semiconductor region surrounds each of said peripheral regions.

26. An integrated semiconductor device according to claim 23, wherein a portion of each of the first semiconductor regions in said functional region adjacent to the surface, which is opposite to the surface to which each second semiconductor region extends, has a higher impurity concentration than the remainde of each of the first semiconductor regions.

27. An integrated semiconductor device according to claim 23, wherein said semiconductor body includes a layer of insulating material selectively formed on each of said first and second surfaces overlying the interfaces of said isolating region and said thin semiconductor layers, the interfaces between said respective thin semiconductor layers and said peripheral regions, and the interfaces between said peripheral regions and said functional regions.

28. An integrated semiconductor device according to claim 27, wherein said body further includes first and second grooves respectively extending into said body from said first and second surfaces thereof, between said first and second pluralities of functional regions and between the functional regions of the same type, respectively, said first and second grooves overlapping said respective interfaces and being filled with glass material as the insulating material therein.

29. An integrated semiconductor device according to claim 24, wherein said semiconductor body includes a layer of insulating material selectively formed on each of said first and second surfaces overlying the interfaces of said isolating region and said thin semiconductor layers, the interfaces between said respective thin semiconductor layers and said peripheral regions, and the interfaces between said peripheral regions and said functional regions.

30. An integrated semiconductor device according to claim 29, wherein said body further includes first and second grooves respectively into said body from said first and second surfaces thereof, between said first and second pluralities of functional regions and between the functional regions of the same type, respectively, said first and second grooves overlapping said respective interfaces and being filled with glass material as the insulating material therein.

31. An integrated semiconductor device according to claim 29, wherein each of said ohmically connecting means comprises an electrode layer formed on that portion of said insulating material between said functional regions and contacting the respective surfaces of said body within said functional regions thereof.

* * * * *